United States Patent
Mieske

(10) Patent No.: US 10,871,513 B2
(45) Date of Patent: Dec. 22, 2020

(54) DIFFERENTIAL PROTECTION METHOD IN AN ELECTRICAL POWER SUPPLY SYSTEM AND PROTECTIVE APPARATUS FOR CARRYING OUT A DIFFERENTIAL PROTECTION METHOD

(71) Applicant: SIEMENS AKTIENGESELLSCHAFT, Munich (DE)

(72) Inventor: Frank Mieske, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 724 days.

(21) Appl. No.: 14/646,780

(22) PCT Filed: Nov. 26, 2012

(86) PCT No.: PCT/EP2012/073586
§ 371 (c)(1),
(2) Date: May 22, 2015

(87) PCT Pub. No.: WO2014/079511
PCT Pub. Date: May 30, 2014

(65) Prior Publication Data
US 2015/0293166 A1    Oct. 15, 2015

(51) Int. Cl.
*G01R 19/10*    (2006.01)
*G01R 31/08*    (2020.01)
(Continued)

(52) U.S. Cl.
CPC ........... *G01R 31/088* (2013.01); *G01R 19/10* (2013.01); *G01R 31/40* (2013.01); *H02H 3/283* (2013.01); *H02H 7/045* (2013.01); *H02H 7/0455* (2013.01)

(58) Field of Classification Search
CPC ...... H02H 7/045; H02H 3/283; G01R 31/027; G01R 31/088; G01R 19/10; H02J 2003/003; G05B 13/048; G05B 13/026
(Continued)

(56) References Cited

U.S. PATENT DOCUMENTS 4,623,949 A   11/1986   Salowe et al.
4,825,326 A   4/1989   Andow et al.
(Continued)

FOREIGN PATENT DOCUMENTS

CN   86105973 A    7/1987
CN   101340078 A   1/2009
(Continued)

OTHER PUBLICATIONS

D. C. Yu, J. C. Cummins, Zhudin Wang, Hong-Jun Yoon and L. A. Kojovic, "Correction of current transformer distorted secondary currents due to saturation using artificial neural networks," in IEEE Transactions on Power Delivery, vol. 16, No. 2, pp. 189-194, Apr. 2001.*
(Continued)

*Primary Examiner* — Muna T Techane
(74) *Attorney, Agent, or Firm* — Laurence Greenberg; Werner Stemer; Ralph Locher

(57) ABSTRACT

A differential protection method for generating a fault signal. Current measurement values are acquired at different measuring points of a component. Differential current values and stabilizing values are formed using the current measurement values, and the fault signal is generated when a tripping range test indicates that a measured value pair formed from one of the differential current values and a respective associated stabilizing value lies in a predetermined tripping range. Differential current values are estimated from successive differential current values and associated stabilizing values and associated estimated stabilizing values are formed. A value of an expected future trend of the differential current values and of the stabilizing current values is estimated. A tripping range test finds the position of a measured value pair formed from an estimated differential current value and the respective associated estimated stabi- (Continued)

lizing value. An electrical protective device has a corresponding evaluation unit.

8 Claims, 5 Drawing Sheets

(51) Int. Cl.
    *H02H 7/045*     (2006.01)
    *H02H 3/28*     (2006.01)
    *G01R 31/40*     (2020.01)

(58) Field of Classification Search
    USPC .......................................................... 702/59
    See application file for complete search history.

(56) References Cited

U.S. PATENT DOCUMENTS

| | | | | |
|---|---|---|---|---|
| 5,808,844 | A * | 9/1998 | Schiel | H02H 3/283 361/36 |
| 6,396,279 | B1 * | 5/2002 | Gruenert | G01R 31/3272 324/418 |
| 7,340,355 | B2 * | 3/2008 | Kang | H02H 7/045 702/58 |
| 7,906,970 | B2 | 3/2011 | Gangadharan et al. | |
| 9,046,553 | B2 * | 6/2015 | Richards | G01R 19/2513 |
| 2004/0024937 | A1 * | 2/2004 | Duncan | H02M 7/003 710/100 |
| 2009/0147412 | A1 * | 6/2009 | Kojovic | H02H 7/0455 361/36 |
| 2010/0264749 | A1 * | 10/2010 | Guzman-Casillas | H02J 3/01 307/105 |

FOREIGN PATENT DOCUMENTS

| | | | | |
|---|---|---|---|---|
| DE | 2339931 A1 | | 2/1975 | |
| EP | 2680385 | * | 6/2012 | ............. H02H 3/26 |
| EP | 2680385 A1 | * | 1/2014 | ............. H02H 3/283 |
| WO | 2008025309 A1 | | 3/2008 | |
| WO | WO 2008025309 A1 | * | 3/2008 | ............. H02H 3/283 |

OTHER PUBLICATIONS

David C. Yu et al; 'Correction of current transformer distorted secondary currents due to saturation using artificial neural networks'; IEEE Transactions on power delivery; vol. 16, No. 2; pp. 189-194; ISSN: 0885-8977; XP011050057; 2001; US; Apr. 1, 2001.

* cited by examiner

DIFFERENTIAL PROTECTION METHOD IN AN ELECTRICAL POWER SUPPLY SYSTEM AND PROTECTIVE APPARATUS FOR CARRYING OUT A DIFFERENTIAL PROTECTION METHOD

BACKGROUND OF THE INVENTION

Field of the Invention

The invention relates to a differential protection method for generating a fault signal, wherein current measurement values are in each case measured at at least two different measurement locations of a component, differential current values and stabilization values are formed using the current measurement values and the fault signal is generated if, in the context of a tripping range test, it is established that a measurement value pair formed using one of the differential current values and a respectively associated stabilization value lies in a predefined tripping range. The invention also relates to a corresponding electrical protective apparatus for carrying out a differential protection method.

Protective apparatuses for carrying out a differential protection method are used for monitoring various components of electrical power supply systems, for example lines, busbars and transformers. In this case, at at least two different measurement locations of the monitored component, the current flowing at the measurement locations is detected and is fed to the protective apparatus in the form of current measurement values. The protective apparatus forms differential current values from the current measurement values by sign-correct addition, said differential current values being used for assessing the operating situation of the monitored component. In the fault-free case, the differential current values lie in a range near zero, since in this case—expressed in a simplified way—the current flowing into the component also flows out of the latter again. On the other hand, if differential current values which deviate significantly from zero arise, then they allow a conclusion to be drawn about a faulty operating state, e.g. an internal short circuit, such that the fault current has to be interrupted by the opening of switching devices that limit the component, e.g. circuit breakers. For this purpose, the protective apparatus generates a corresponding fault signal that causes the switches to open their switching contacts.

Since ideal relations, e.g. a differential current in the fault-free case having exactly the value zero, are not present in practice, a suitable comparison value has to be found for the differential current. For this purpose, the so-called stabilization value is used, which is calculated differently depending on the component; by way of example, in the case of line differential protection, the stabilization value results as the sum of the absolute values of the respective current measurement values. If a differential current value and an associated stabilization value are plotted in a tripping diagram, the respective measurement value pair lies either within or outside a defined tripping range, such that the formation of the fault signal can be deduced by the evaluation of the position of the measurement value pair; the fault signal is generated if the measurement value pair lies within the predefined tripping range.

Problems arise in this case, for example, if one or more of the current transformers used, particularly under transient conditions at the beginning of an internal or external fault of high current intensity, attain saturation and the secondary current profile output by them does not represent a correct mapping of the primary-side current profile. In such cases, for example, in the event of external faults, that is to say faults situated outside the monitored component, it is possible, erroneously, for a significant differential current to be identified and a fault signal thus to be generated, while on the other hand, in the event of internal faults, that is to say faults directly concerning the monitored component, formation of the fault signal erroneously fails to occur on account of an excessively low differential current determined.

A differential protection method and a corresponding differential protective apparatus of the type mentioned in the introduction are known for example from WO 2008/025309 A1. In the case of the known differential protective apparatus, the current profiles detected at the different measurement locations are checked with regard to similarity and the sensitivity of the tripping of the differential protection is adapted in accordance with the identified similarity. What can be achieved in this way is that in the case of current profiles that are dissimilar—e.g. as a result of transformer saturation—the sensitivity of the differential protective apparatus is correspondingly reduced in order that a fault signal is not output in an undesired manner.

BRIEF SUMMARY OF THE INVENTION

The invention is based on the object of specifying an alternative method and protective apparatus in order to selectively distinguish an external fault from an internal fault even in the case of the occurrence of transformer saturation and to generate a fault signal with high reliability when an internal fault is present.

This object is achieved according to the invention by means of a method of the generic type in which from successive differential current values and associated stabilization values, estimated differential current values and associated estimated stabilization values are formed, which are used to estimate at least one value of an expected future profile of the differential current values and stabilization current values, and the position of a measurement value pair formed from an estimated differential current value and the respectively associated estimated stabilization value is evaluated for the tripping range test.

The invention is based on the insight that even in a transient transition phase at the beginning of an internal or external fault of high current intensity, a brief saturation-free state of the current transformers is usually still present and the current measurement values detected within this saturation-free time thus reliably map the state of the monitored component. If differential current values and stabilization values determined on the basis of such reliable current measurement values are then used to form estimated differential current values and stabilization values which estimate at least one value of an expected future profile of the differential current values and stabilization values, then on this basis it is possible as it were to draw a conclusion about future values—present during a possible saturation phase—of the differential current values and of the stabilization values. If these estimated values are used for the tripping range test, then even in the event of possible incipient transformer saturation it is thereby possible to take a decision about whether an internal or an external fault is present, such that instances of incorrect tripping as a result of a current transformer saturation are avoided.

The components for which the differential protection method described can be used can be any desired components: by way of example, lines, transformers, busbars, system sections and so forth are appropriate as components.

The differential current values are formed from the current measurement values by sign-correct addition, while the stabilization values are formed component-specifically, i.e. differently depending on the type of monitored component: by way of example, in the case of a line or a busbar as monitored component, the absolute values of the current measurement values of all the measurement locations are added in order to form the stabilization values, while in the case of a transformer as monitored component, the RMS value of the current measurement values is used as the stabilization value. Preferably, in the case of polyphase components, the current measurement values at the measurement locations are detected phase by phase and the differential current values and stabilization values are correspondingly formed phase by phase.

One advantageous embodiment of the method according to the invention provides that in each case the present differential current value and the differential current value directly preceding the latter are used for forming a respective estimated differential current value, and in each case the present stabilization value and the stabilization value directly preceding the latter are used for forming a respective estimated stabilization value.

In this way, a decision about the presence of an internal or external fault can be taken very rapidly after the appearance of an internal or external fault, namely using just two successive current measurement values (or differential current values and stabilization values formed therefrom). In particular, said decision can be taken more rapidly than with the use of so-called RMS (root mean square) values of the differential current values and stabilization values, since significantly more differential current values and respectively stabilization values are required for the latter until they constitute a reliable mapping of the actual current profiles; furthermore, if transformer saturation occurs, the number of measurement values available from the saturation-free time is often inadequate for forming reliable RMS values.

In accordance with one advantageous embodiment of the method according to the invention, in this context it can be provided that the respective estimated values indicate an amplitude of the expected future profile of the differential current values and an amplitude of the expected future profile of the stabilization values.

As a result, even at the beginning of the transient transition phase upon the occurrence of a fault, the amplitude can be used to estimate a respective maximum value of the differential current values and the stabilization values and said maximum value can be used to take a decision about the presence of an internal or external fault.

Specifically, in this context it can be provided that the respective estimated differential current value and the respective estimated stabilization value are formed in each case using a first estimated value portion formed by means of an integrating element and a second estimated value portion formed by means of a differentiating element.

In this way, the estimated values can be formed using relatively simple mathematical operations, namely firstly by differentiation (or formation of a differential quotient) and secondly by integration with sufficient accuracy.

The formation of the estimated values will be specifically explained by way of example on the basis of the amplitude of the stabilization values; the procedure for the differential current values is implemented correspondingly.

The amplitude $\hat{A}$ of the future expected profile of the stabilization values is formed taking as a basis a substantially sinusoidal signal in accordance with the following trigonometric relationship (1):

$$\hat{A}^2 = \hat{A} \cdot \cos^2 \omega x + \hat{A} \cdot \sin^2 \omega x \tag{1}$$

In this case, $\hat{A}$ stands for the amplitude of the sinusoidal signal $y=f(x)$ and $\omega$ stands for the angular velocity.

Since the 1$^{st}$ derivative of a periodic sinusoidal signal $y=\hat{A}\cdot\sin \omega x$ can be represented as $y'=\omega\hat{A}\cdot\cos \omega x$, relationship (1) above can be converted into the following form (2):

$$\hat{A} = \sqrt{y^2 + (y')^2} \tag{2}$$

The first estimated value portion y can be determined by means of an integrating element on the basis of the present value (k) and a value (k-1) directly preceding the latter in the profile of the stabilization values $i_{stab}$:

$$y(k) = F_{int} \cdot (i_{Stab}(k) + i_{Stab}(k-1)) \tag{3}$$

In this case, $F_{int}$ represents a scaling factor that takes account of the low-pass filter behavior of the transfer function of the integrating element.

Since, for—in relation to the system period T—very small sampling intervals $T_A$, that is to say the time duration between two samples when detecting the measured signal, the 1$^{st}$ derivative y' can be approximated as a differential quotient, the second estimated value portion y' is determined by means of a differentiating element as a differential quotient on the basis of the present value (k) and the value (k-1) directly preceding the latter in the profile of the stabilization values $i_{Stab}$:

$$y'(k) = \frac{\Delta i_{Stab}}{\Delta t} = \frac{\Delta i_{Stab}}{T_A} = F_{dif} \cdot (i_{Stab}(k) - i_{Stab}(k-1)) \tag{4}$$

In this case, $F_{dif}$ represents a scaling factor that takes account of the high-pass filter behavior of the transfer function of the differentiating element.

Consequently, the estimated value for the amplitude $\hat{A}$ of the expected future profile of the stabilization values can be formed using the following equation (5):

$$\hat{A}(k) = \frac{1}{\sqrt{2}} \sqrt{(F_{int} \cdot (i_{Stab}(k) + i_{Stab}(k-1)))^2 + (F_{dif} \cdot (i_{Stab}(k) + i_{Stab}(k-1)))^2} \tag{5}$$

The scaling factors $F_{int}$ and $F_{dif}$ can be determined as follows:

The transfer function $\hat{G}_{int}$ of the integrating element in discrete notation can be regarded as a non recursive low-pass filter having the portions $a_0=1$ and $a_1=1$:

$$\hat{G}_{int}(z) = a_0 + a_1 z^{-1} \tag{6}$$

With $$z^{-1} = e^{-j\omega T_A} = \cos \omega T_A - \sin \omega T_A \tag{7}$$

the amplitude response of the integrating element results as $$\hat{G}_{int}(j\omega) = 1 + \cos \omega T_A - j \sin \omega T_A$$

$$|G_{int}(j\omega)| \sqrt{2 + 2\cos\omega T_A} = \sqrt{2 + 2\cos 2\pi f / f_A} \tag{8}$$

In this case, f stands for the system frequency and $f_A$ stands for the sample frequency during signal detection. The scaling factor $F_{int}$ of the integrating element is the reciprocal of the amplitude response. Given an assumed system frequency of 50 Hz and a sampling frequency of 1000 Hz, a value of approximately 0.05 thus results for the scaling factor $F_{int}$.

The transfer function $\hat{G}_{dif}$ of the differentiating element (or of the differential quotient) in discrete notation can be regarded as a nonrecursive high-pass filter having $a_0=1$ and $a_1=-1$:

$$\hat{G}_{dif}(z)=a_0+a_1 z^{-1} \qquad (9)$$

With the relationship (7), the amplitude response of the differentiating element results as $$\hat{G}_{int}(j\omega)=1-\cos \omega T_A + j \sin \omega T_A$$

$$|G_{int}(j\omega)|\sqrt{2+2\cos\omega T_A}=\sqrt{2+2\cos 2\pi f/f_A} \qquad (10)$$

The scaling factor $F_{dif}$ of the differentiating element is the reciprocal of the amplitude response. Given an assumed system frequency of 50 Hz and a sampling frequency of 1000 Hz, a value of approximately 3.196 thus results for the scaling factor $F_{dif}$.

If the system frequency is suitably tracked using the sampling frequency, the scaling factors $F_{int}$ and $F_{dif}$ remain constant.

In accordance with a further advantageous embodiment, it is provided that the outputting of a fault signal is blocked if a predefined number of successive measurement value pairs lie in a predefined stabilization range.

The provision of a separate stabilization range within the tripping diagram makes it possible to deduce the presence of an internal or external fault comparatively simply and with high selectivity on the basis of the position of the measurement value pairs of the respective estimated values. If e.g. two successive measurement value pairs lie within the separate stabilization range, then this is rated as a sign of the presence of an external fault and the outputting of a fault signal is correspondingly blocked—at least temporarily.

In order to further increase the reliability of tripping in the case of an internal fault, in accordance with a further advantageous embodiment of the method according to the invention, it is proposed that the estimated differential current values are also compared with a differential current threshold value and the fault signal is also generated if a predefined number of successive estimated differential current values exceed the differential current threshold value.

In this way, virtually in parallel with the tripping range test, a test of the magnitude of the estimated differential current values by means of comparison with a differential current threshold value is carried out and an internal fault is deduced e.g. in the case of two successive, particularly high (i.e. lying above the threshold value) estimated differential current values independently of the position of the measurement value pair. As a result, a fault signal can be generated particularly rapidly in particularly unambiguous cases with high estimated differential current values.

The invention furthermore relates to an electrical protective apparatus for forming a fault signal comprising connections for direct or indirect connection to at least two different measurement locations of a component, comprising an evaluation device designed to form differential current values and stabilization values using current measurement values and to generate a fault signal if a measurement value pair formed using one of the differential current values and the respectively associated stabilization value lies in a predefined tripping range.

According to the invention, with regard to the electrical protective apparatus, it is provided that the evaluation device is designed to form, from successive differential current values and associated stabilization values, estimated differential current values and associated estimated stabilization values, which are used to estimate at least one value of an expected future profile of the differential current values and the stabilization current values, and is designed to evaluate the position of a measurement value pair formed from an estimated differential current value and the respectively associated estimated stabilization value for the tripping range test.

In accordance with one advantageous embodiment of the protective apparatus according to the invention, it is provided that the evaluation device is designed to block the outputting of a fault signal if a predefined number of successive measurement value pairs lie in a predefined stabilization range.

A further advantageous embodiment of the protective apparatus according to the invention additionally provides that the evaluation device is designed also to compare the estimated differential current values with a differential current threshold value and also to generate the fault signal if a predefined number of successive estimated differential current values exceed the differential current threshold value.

With regard to the advantages of the protective apparatus according to the invention, reference should be made to the above explanations in association with the method according to the invention, since the advantages of the protective apparatus according to the invention and those of the method according to the invention substantially correspond to one another.

The invention is explained in greater detail below on the basis of exemplary embodiments; in this case, in the figures by way of example:

BRIEF DESCRIPTION OF THE SEVERAL VIEWS OF THE DRAWING

In FIGS. 1-5, the same reference signs are always used for identical or comparable components, for reasons of clarity.

DESCRIPTION OF THE INVENTION

Figure 1:
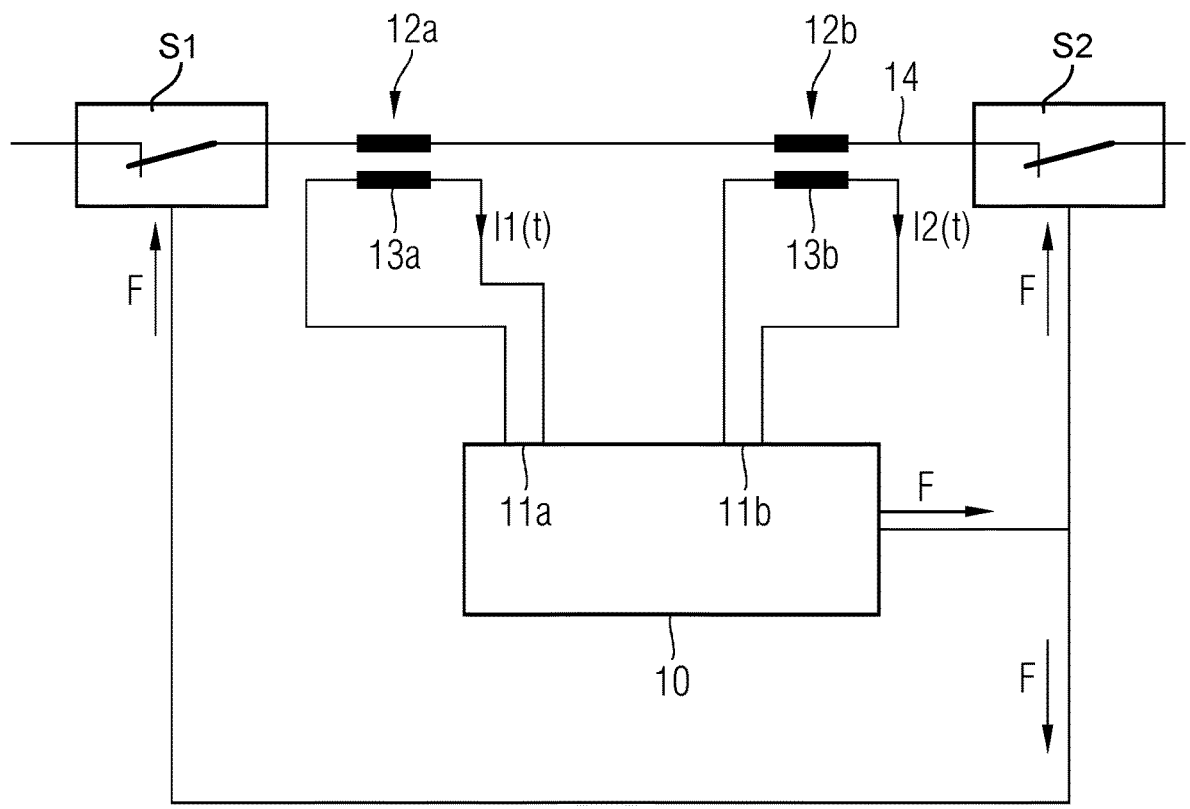
FIG. 1 shows an arrangement with one exemplary embodiment of a protective apparatus according to the invention.

FIG. 1 reveals an arrangement with one exemplary embodiment of a protective apparatus 10 comprising two connections 11a and 11b for connection to two measurement locations 12a and 12b. The two measurement locations 12a, 12b are formed by two current transformers 13a and 13b, which are connected to a phase conductor 14 of a monitored component (not illustrated in any further detail) of a power supply system, for example in the form of a power supply line.

The two current transformers 13a and 13b generate current signals I1(t) and I2(t) on the output side, said current signals representing the current profile at the two measurement locations 12a, 12b. The protective apparatus 10 detects said current signals, determines current measurement values therefrom by sampling and thereupon checks said current measurement values to ascertain whether they indicate the presence of a faulty operating state, e.g. an internal short circuit, of the component, and if appropriate generates a fault signal F on the output side if such a faulty operating state was established. The fault signal F serves to cause switching devices S1 and S2, that limit the component, e.g. circuit breakers, to open their switching contacts in order to isolate the fault from the rest of the power supply system.

For this purpose, a protective apparatus in accordance with the prior art forms differential current values and associated stabilization values from related, i.e. simultaneously detected, current measurement values and checks the position of a measurement value pair consisting of a differential current value and a stabilization value in a tripping diagram. If the measurement value pair lies within a tripping range an internal fault is deduced and the fault signal is generated.

Figure 2:
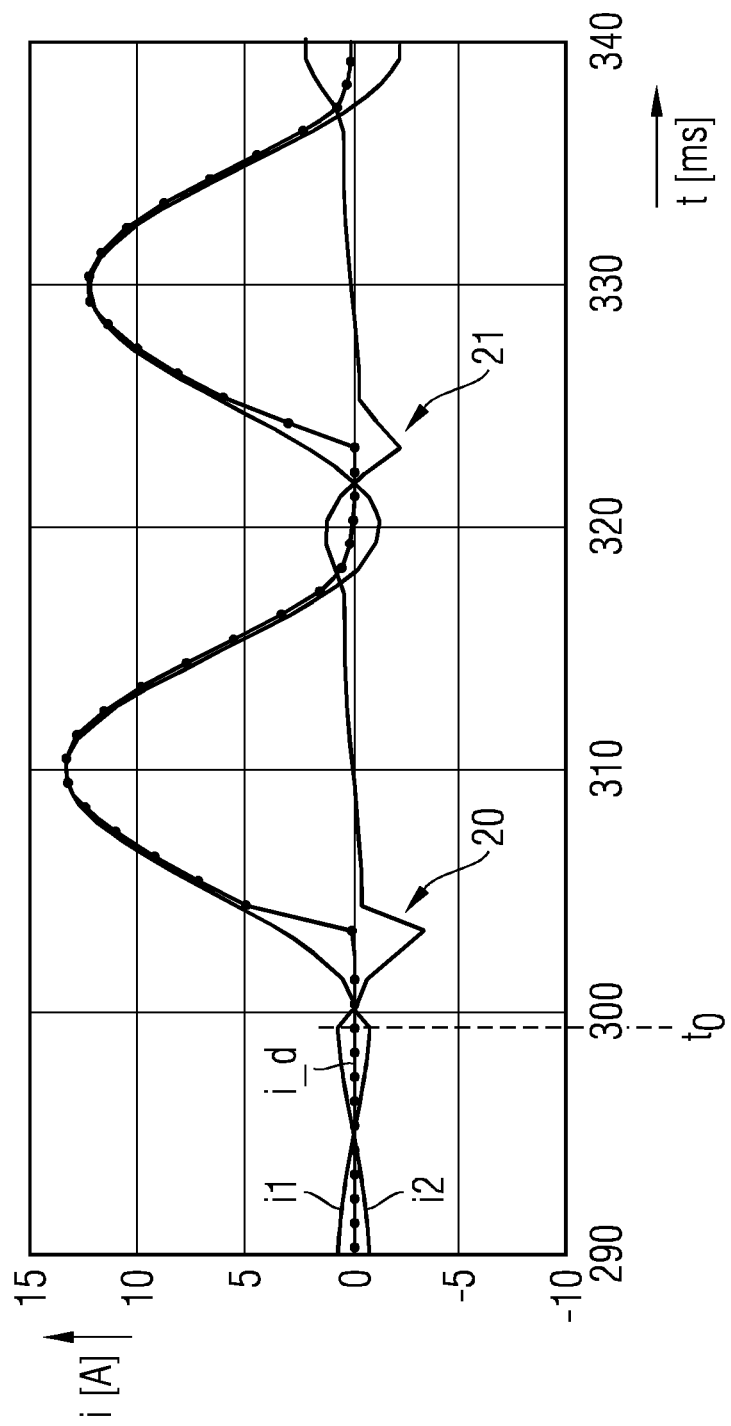
FIG. 2 shows a first current-time diagram for elucidating the influence of the transformer saturation on the determination of a differential current in the event of an external fault.

FIG. 2 illustrates a current-time diagram showing a current signal i1 output by a first current transformer on the output side, a current signal i2 output by a second current transformer, and the profile of differential current values i_d formed from corresponding current measurement values. At the instant $t_0$, an external fault of high current intensity occurs, i.e. a fault outside the monitored component, which therefore should not lead to tripping of the protective apparatus. While the first current transformer exhibits no saturation effects, the current signal i2 output by the second current transformer is impaired by saturation effects; said saturation effects are discernible in the regions 20 and 21, for example. It is clearly discernible that the formed profile of the differential current values i_d no longer permits a reliable statement about the operating state of the monitored component upon the occurrence of the current transformer saturation in the region 20, since, on account of the current signal i2 corrupted by the current transformer saturation, a significant differential current now occurs despite the external fault, said differential current almost assuming the value of the current signal i1.

Figure 3:
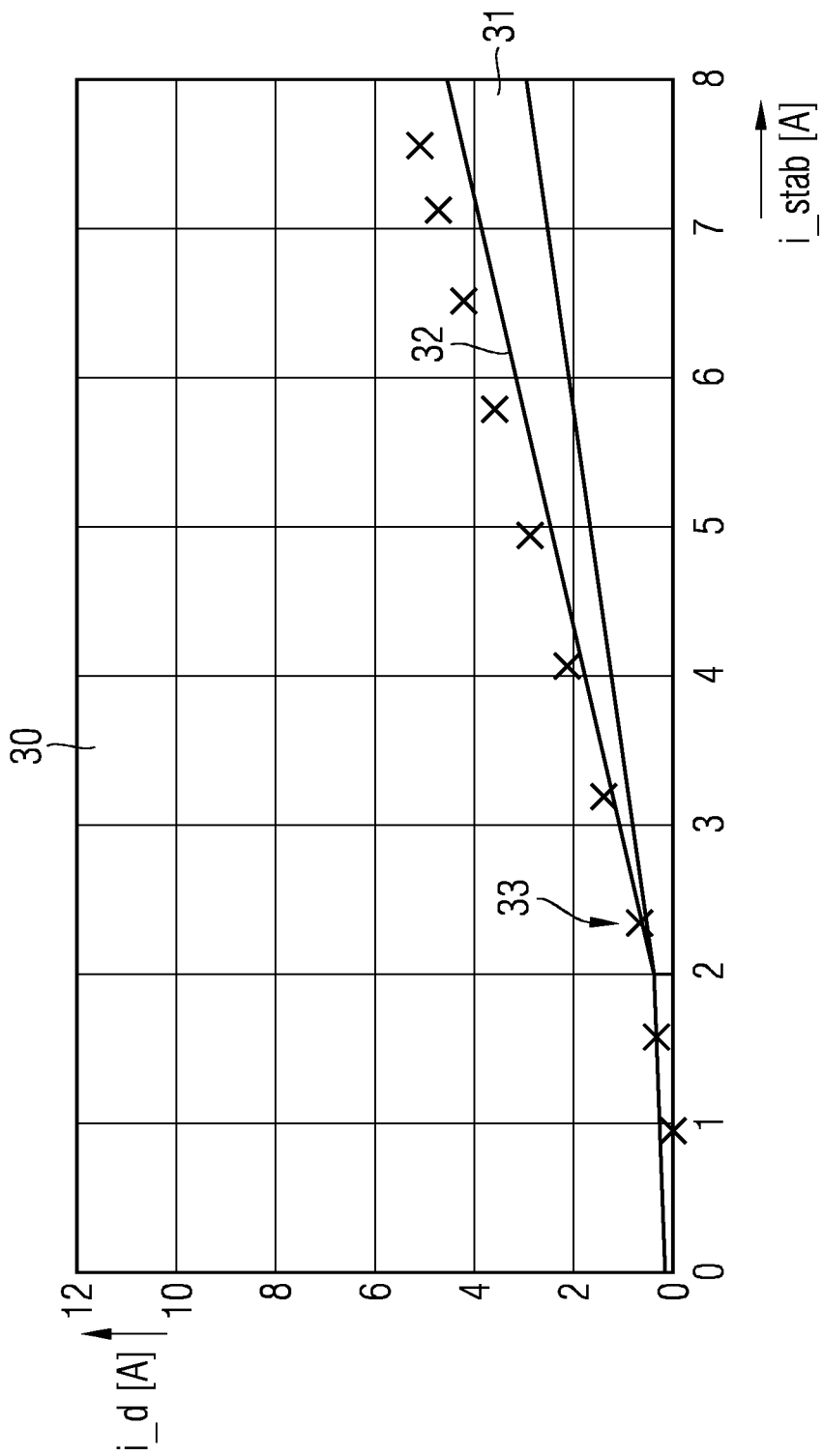
FIG. 3 shows a first tripping diagram with a tripping characteristic curve which separates a tripping range from a "non-tripping range" within the tripping diagram.

FIG. 3 illustrates by way of example a tripping diagram into which measurement value pairs—influenced by current transformer saturation—of the differential current values I d and stabilization values I stab are plotted as crosses. The tripping diagram has a tripping range 30 separated from a normal range 31 by a tripping characteristic curve 32. A stabilization range is plotted within the normal range for additional stabilization, the functioning of which stabilization range will be explained in greater detail in association with FIG. 5. It is evident that starting from the occurrence of the transformer saturation, which first has an effect on the measurement value pair 33, the measurement value pairs lie in the tripping range 30 despite the presence of an external fault, and this would lead incorrectly to the formation of a fault signal. Correspondingly, in the case of an internal fault, a current transformer saturation present can have an effect such that, erroneously, an external fault is identified and thus no fault signal is generated.

Figure 4:
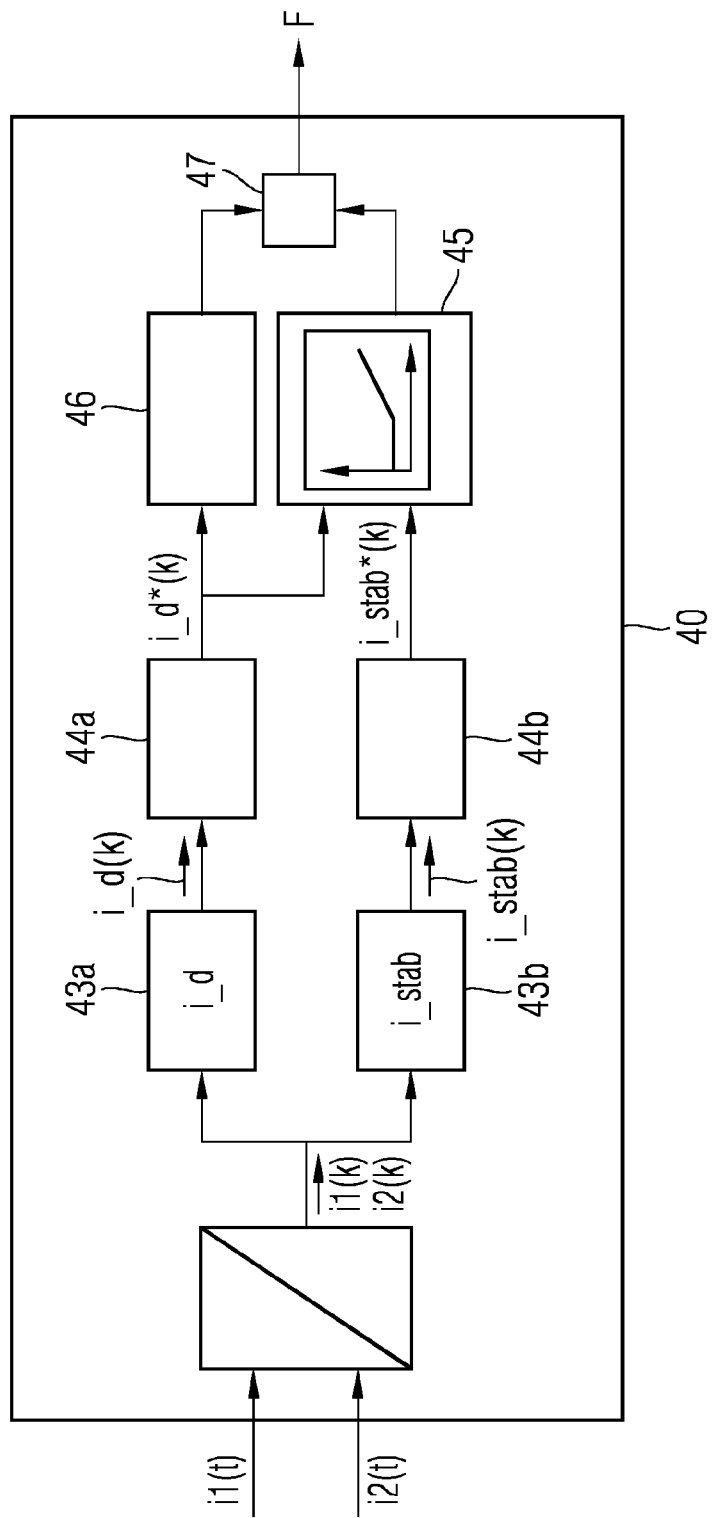
FIG. 4 shows a schematic block diagram of an evaluation device for detailed elucidation of the functioning of one exemplary embodiment of a protective apparatus according to the invention.

In order to avoid incorrect decisions on account of the occurrence of transformer saturation, a protective apparatus according to the invention comprises an evaluation device designed for example in accordance with the exemplary embodiment illustrated in FIG. 4. FIG. 4 shows an evaluation device 40 of a protective apparatus. The components of the evaluation device described below can for example be implemented in the form of control software or be formed by hardware components embodied as electronic circuits.

The current signals i1(t) and i2(t) are fed to a measurement value input 41 of the evaluation device 40 and are converted into current measurement values i1(k) and i2(k) by means of a sampling device 42. Said current measurement values i1(k) and i2(k) are output by the sampling device 42 on the output side and fed to a first block 43a for forming a differential current value i_d(k) and to a second block 43b for forming a stabilization value i_stab(k). For this purpose, the first block 43a forms the absolute value of the sign-correct sum of the current measurement values i1(k) and i2(k):

$$i\_d(k)=|i1(k)+i2(k)|.$$

Since currents which flow into the component and out of it are treated differently with regard to their sign, a differential current value i_d(k) equal to (or close to) zero arises in the fault-free case where i1(k) and i2(k) are equal in terms of absolute value.

The second block 43b forms a respective stabilization value I stab(k) in a component-specific manner; in the case of a power transmission line as assumed in FIG. 1, the stabilization value i_stab(k) is formed by addition of the absolute values of the current measurement values of all the measurement locations (that is to say here of the two measurement locations 12a and 12b):

$$i\_stab(k)=|i1(k)|+|i2(k)|.$$

The respective differential current value i_d(k) and stabilization value i_stab(k) are output by the blocks 43a and 43b on the output side.

The differential current value i_d(k) is thereupon fed to a first estimator block 44a for forming an estimated differential current value by i_d*(k). The estimated differential current value in this case indicates at least one value of an expected future profile of the differential current values and can be formed, for example, as already explained above, as amplitude of the profile of the differential current values from the present differential current value i_d(k) and a differential current value i_d(k−1) formed directly beforehand.

In a corresponding manner, the stabilization value i_stab (k) is fed to a second estimator block 44b for forming an estimated stabilization value i_stab*(k). The estimated stabilization value in this case indicates at least one value of an expected future profile of the stabilization values and can be formed, for example, as already explained above, as amplitude of the profile of the stabilization values from the present stabilization value i_stab(k) and a stabilization value i_stab (k−1) formed directly beforehand.

Both the estimated differential current value i_d*(k) and the associated estimated stabilization value i_stab*(k) are fed to a test block 45, which performs a test of the position of a measurement value pair formed from these values in a tripping diagram. If the measurement value pair lies within the tripping range, the fault signal F is generated. By contrast, if the measurement value pair lies within the normal range, then the outputting of a fault signal is blocked.

Figure 5:
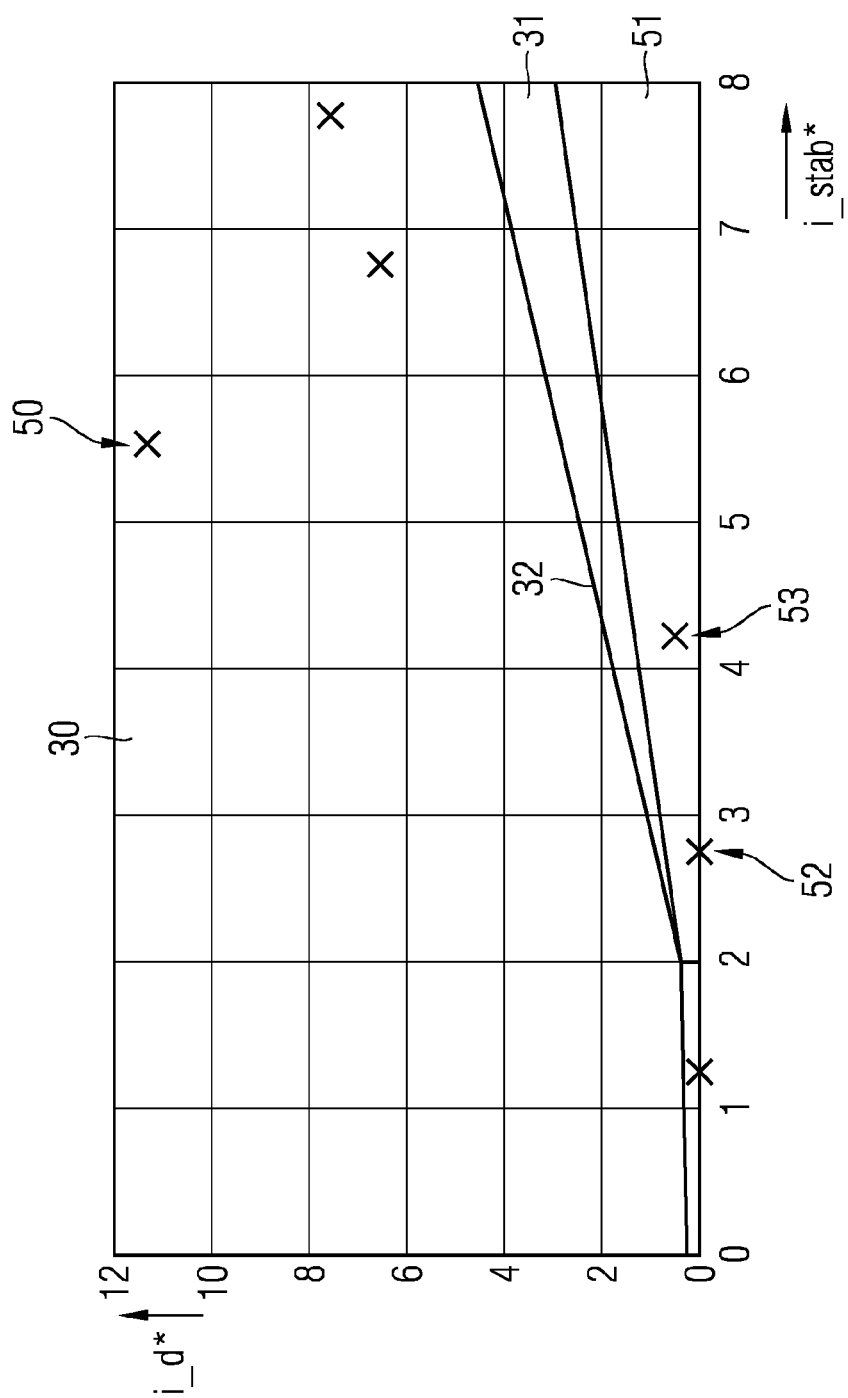
FIG. 5 shows a second tripping diagram for elucidating the effect of the inventive method on the possibility of distinguishing internal and external faults.

In this respect, FIG. 5 shows a tripping diagram comparable in principle to the diagram in accordance with FIG. 3, in which tripping diagram measurement value pairs composed of estimated differential current values i_d*(k) and associated estimated stabilization values i_stab* for the case of an external fault with the occurrence of transformer saturation are plotted. On account of the fact that the respective estimated values are based only on two current measurement values and can thus be determined at an early stage after the onset of the fault —and thus in the saturation-free time of the current transformers —the profile of the measurement value pairs as illustrated in FIG. 5 is manifested. The transformer saturation that occurs becomes apparent only starting from the measurement value pair 50; by contrast, the two measurement value pairs 52 and 53 formed before that lie within the stabilization range 51 which is provided in the normal range 31 and which indicates the presence of a transformer saturation. The protection algorithm of the protective apparatus can be set with regard to the treatment of said stabilization range 51 in such a way that outputting of a fault signal F is blocked if a predefined number of measurement value pairs are present within the stabilization range. In the case illustrated in FIG. 5, the corresponding parameter should be chosen for a value of 2, in order that the two measurement value pairs 52, 53 lying in the stabilization range trigger a (temporary) blocking of the outputting of a fault signal, such that no fault signal F is generated despite the following measurement value pairs lying within the tripping range 30.

In addition to the above-described functioning for forming the fault signal F, the evaluation device 40 in accordance with FIG. 4 can also have a further test block 46, to which the estimated differential current values i_d*(k) are fed on the input side. The test block 46 compares the estimated differential current values i_d*(k) with a predefined differential current threshold value and outputs a signal on the output side if a predefined number (e.g. 2) of estimated differential current values lie above the differential current threshold value. In this case, an OR element 47 is disposed downstream of the two test blocks 45 and 46 and outputs the fault signal F on the output side if either the first test block 45 or the second test block (or both test blocks) identifies (identify) an internal fault and correspondingly outputs (output) a signal.

The invention claimed is:

1. A differential protection method for generating a fault signal and for protecting an electrical component in an electrical system, the method comprising:
    measuring respective current measurement values at two or more different measurement locations of the component with current transformers at the measurement locations of the component;
    forming differential current values and stabilization values from the current measurement values;
    estimating, from successive differential current values and associated stabilization values, estimated differential current values and associated estimated stabilization values, and estimating therefrom at least one value of an expected future profile of the differential current values and the associated stabilization values;
    forming a respective estimated differential current value in each case from a present differential current value and a differential current value directly preceding the present differential current value, and forming a respective estimated stabilization value in each case from a present stabilization value and a stabilization value directly preceding the present stabilization value;
    conducting a tripping range test by evaluating a position of a measurement value pair formed from an estimated differential current value and a respectively associated estimated stabilization value; and
    if the tripping range test indicates that a measurement value pair formed from one of the estimated differential current values and the respectively associated estimated stabilization value lies in a predefined tripping range, generating the fault signal to cause switching devices for limiting the component to open and to disconnect the component from the electrical system.

2. The method according to claim 1, wherein the respective estimated current values indicate an amplitude of the expected future profile of the differential current values and an amplitude of the expected future profile of the stabilization values.

3. The method according to claim 2, which comprises in each case calculating a first estimated value portion formed by an integrating element and calculating a second estimated value portion formed by a differentiating element; and forming the respective estimated differential current value and the respective estimated stabilization value.

4. The method according to claim 1, which comprises blocking an output of the fault signal if a predefined number of successive measurement value pairs lie in a predefined stabilization range.

5. The method according to claim 1, which further comprises comparing the estimated differential current values with a differential current threshold value and also generating the fault signal if a predefined number of successive estimated differential current values exceed the differential current threshold value.

6. A differential protection method for generating a fault signal and for protecting a component of an electrical system, the method comprising:
    measuring respective current measurement values at two or more different measurement locations of the component with current transformers at the measurement locations of the component;
    forming differential current values and stabilization values from the current measurement values;
    estimating, from successive differential current values and associated stabilization values, estimated differential current values and associated estimated stabilization values, and estimating therefrom at least one value of an expected future profile of the differential current values and the associated stabilization values;
    forming a respective estimated differential current value in each case from a present differential current value and a differential current value directly preceding the present differential current value, and forming a respective estimated stabilization value in each case from a present stabilization value and the stabilization value directly preceding the present stabilization value;
    conducting a tripping range test by evaluating a position of a measurement value pair formed from an estimated differential current value and a respectively associated estimated stabilization value; and
    if the tripping range test indicates that a measurement value pair formed from one of the estimated differential current values and the respectively associated estimated stabilization value lies in a predefined tripping range, generating the fault signal to cause switching devices for limiting the component to open and to disconnect the component from the electrical system; and
    comparing the estimated differential current values with a differential current threshold value and also generating the fault signal if a predefined number of successive estimated differential current values exceed the differential current threshold value to cause the switching devices for limiting the component to open and to disconnect the component from the electrical system.

7. An electrical protective apparatus for forming a fault signal and for protecting an electrical component, the apparatus comprising:
   connections for direct or indirect connection of at least two current transformers disposed at mutually different measurement locations of the electrical component;
   an evaluation device connected to receive current signals from said current transformers through said connections, said evaluation device configured to convert said current signals into current measurement values;
   said evaluation device being configured to form differential current values and stabilization values from the current measurement values, and said evaluation device being configured to:
   estimate, from successive differential current values and associated stabilization values, estimated differential current values and associated estimated stabilization values, and to estimate therefrom at least one value of an expected future profile of the differential current values and the associated stabilization values;
   form a respective estimated differential current value in each case from a present differential current value and a differential current value directly preceding the present differential current value, and to form in each case a respective estimated stabilization value from the present stabilization value and the stabilization value directly preceding the present stabilization value;
   conduct a tripping range test by evaluating a position of a measurement value pair formed from an estimated differential current value and a respectively associated estimated stabilization value; and
   if the tripping range test indicates that a measurement value pair formed from one of the estimated differential current values and the respectively associated estimated stabilization value lies in a predefined tripping range, to generate the fault signal to cause switching devices for limiting the electrical component to open and to disconnect the electrical component.

8. A differential protection method for generating a fault signal and for protecting an electrical component in an electrical system, the method comprising:
   measuring respective current measurement values at two or more different measurement locations of the component with current transformers at the measurement locations of the component;
   forming differential current values and stabilization values from the current measurement values;
   estimating, from successive differential current values and associated stabilization values, estimated differential current values and associated estimated stabilization values, and estimating therefrom at least one value of an expected future profile of the differential current values and the associated stabilization values;
   forming a respective estimated differential current value in each case from a present differential current value and a differential current value directly preceding the present differential current value, and forming a respective estimated stabilization value in each case from a present stabilization value and a stabilization value directly preceding the present stabilization value;
   conducting a tripping range test by evaluating a position of a measurement value pair formed from an estimated differential current value and a respectively associated estimated stabilization value;
   if the tripping range test indicates that a measurement value pair formed from one of the estimated differential current values and the respectively associated estimated stabilization value lies in a predefined tripping range, generating the fault signal to cause switching devices for limiting the component to open and to disconnect the component from the electrical system; and
   if a predefined number of successive measurement value pairs lie in a predefined stabilization range, blocking an output of the fault signal.

* * * * *